US010571638B2

(12) United States Patent
Talebzadeh et al.

(10) Patent No.: US 10,571,638 B2
(45) Date of Patent: Feb. 25, 2020

(54) APPARATUS SYSTEM, AND METHOD FOR MITIGATING ELECTROMAGNETIC NOISE IN CONNECTION WITH OPTICAL MODULES IN TELECOMMUNICATIONS DEVICES

(71) Applicant: Juniper Networks, Inc., Sunnyvale, CA (US)

(72) Inventors: Atieh Talebzadeh, Campbell, CA (US); Philippe C. Sochoux, Redwood City, CA (US); Jing Li, Sunnyvale, CA (US); Qian Liu, Santa Clara, CA (US); Kaustav Ghosh, Rolla, MO (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/884,593

(22) Filed: Jan. 31, 2018

(65) Prior Publication Data

US 2019/0235187 A1 Aug. 1, 2019

(51) Int. Cl.
*H05K 9/00* (2006.01)
*G02B 6/42* (2006.01)
*H04B 15/02* (2006.01)
*H05K 1/18* (2006.01)

(52) U.S. Cl.
CPC ........... *G02B 6/4277* (2013.01); *G02B 6/428* (2013.01); *G02B 6/4269* (2013.01); *H04B 15/02* (2013.01); *H05K 1/18* (2013.01); *H05K 9/0015* (2013.01); *H05K 2201/10121* (2013.01)

(58) Field of Classification Search
CPC .................. H05K 1/18; H05K 9/0015; H05K 2201/10121; H04B 15/02; G02B 6/4269; G02B 6/428; G02B 6/4277
USPC .................................................. 361/816, 818
See application file for complete search history.

(56) References Cited

U.S. PATENT DOCUMENTS

| | | | | |
|---|---|---|---|---|
| 6,330,745 B1 * | 12/2001 | Cromwell | ........... | H01L 23/3675 174/541 |
| 6,856,769 B1 * | 2/2005 | Steffensen | ........... | G02B 6/4246 385/94 |
| 6,930,884 B2 * | 8/2005 | Cromwell | ........... | H01L 23/4093 257/718 |
| 7,355,857 B2 * | 4/2008 | Pirillis | ............... | H05K 7/20418 165/80.3 |
| 7,625,223 B1 * | 12/2009 | Fogg | ..................... | H05K 5/0247 361/715 |
| 7,859,849 B2 * | 12/2010 | Ice | ..................... | H05K 7/20418 361/704 |
| 8,670,236 B2 * | 3/2014 | Szczesny | ............. | H05K 9/0009 165/104.33 |

(Continued)

*Primary Examiner* — Hung S. Bui
(74) *Attorney, Agent, or Firm* — FisherBroyles, LLP

(57) ABSTRACT

The disclosed apparatus may include (1) a cage that (A) is coupled to a circuit board of a telecommunications device and (B) houses the optical module when the optical module is installed in the telecommunications device, (2) a heatsink that (A) makes physical contact with the optical module via an opening of the cage and (B) absorbs heat generated by the optical module during operation in the telecommunications device, and (3) a gasket that (A) resides between the heatsink and the cage and (B) reduces electromagnetic noise in connection with the operation of the optical module in the telecommunications device. Various other apparatuses, systems, and methods are also disclosed.

18 Claims, 6 Drawing Sheets

(56) References Cited

U.S. PATENT DOCUMENTS 9,325,100 B2 * 4/2016 Hirschy ................ H01R 13/46

* cited by examiner

APPARATUS SYSTEM, AND METHOD FOR MITIGATING ELECTROMAGNETIC NOISE IN CONNECTION WITH OPTICAL MODULES IN TELECOMMUNICATIONS DEVICES

BACKGROUND

Telecommunications devices (such as routers) often include optical modules that facilitate communication with other devices within a network and/or across networks. For example, a router may include a row of 6 optical modules that collectively facilitate communication with various other routers within a network. During operation, these optical modules may generate a significant amount of electromagnetic noise. Unfortunately, such electromagnetic noise may interfere with and/or inhibit the performance of the surrounding optical modules, other components within the router, and/or nearby computing devices.

Moreover, governmental regulatory bodies may implement regulations that limit the amount of electromagnetic radiation that these optical modules are allowed to emit. For example, regulations in the United States of America may limit the amount of electromagnetic radiation emitted by such optical modules to 6 decibels. Unfortunately, as this technology advances and its performance improves, the optical modules may generate greater amounts of electromagnetic radiation, potentially approaching and/or exceeding such regulatory limits.

The instant disclosure, therefore, identifies and addresses a need for additional and improved apparatuses, systems, and methods for mitigating electromagnetic noise in connection with optical modules in telecommunications devices.

SUMMARY

As will be described in greater detail below, the instant disclosure generally relates to apparatuses, systems, and methods for mitigating electromagnetic noise in connection with optical modules in telecommunications devices. In one example, an apparatus for accomplishing such a task may include (1) a cage that (A) is coupled to a circuit board of a telecommunications device and (B) houses the optical module when the optical module is installed in the telecommunications device, (2) a heatsink that (A) makes physical contact with the optical module via an opening of the cage and (B) absorbs heat generated by the optical module during operation in the telecommunications device, and (3) a gasket that (A) resides between the heatsink and the cage and (B) reduces electromagnetic noise in connection with the operation of the optical module in the telecommunications device.

Similarly, a telecommunications device incorporating the above-described apparatus may include (1) an optical module that facilitates communication, (2) a cage that (A) is coupled to a circuit board and (B) houses the optical module when the optical module is installed, (3) a heatsink that (A) makes physical contact with the optical module via an opening of the cage and (B) absorbs heat generated by the optical module during operation, and (4) a gasket that (A) resides between the heatsink and the cage and (B) reduces electromagnetic noise in connection with the operation of the optical module.

A corresponding method may include (1) coupling, to a circuit board of a telecommunications device, a cage for housing an optical module that facilitates communication for the telecommunications device, (2) placing a heatsink against the cage such that, when the optical module is installed in the cage, (A) the heatsink makes physical contact with the optical module via an opening of the cage and (B) the heatsink rises as a result of the physical contact with the optical module, and then (3) applying a gasket between the heatsink and the cage to reduce electromagnetic noise in connection with the operation of the optical module.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
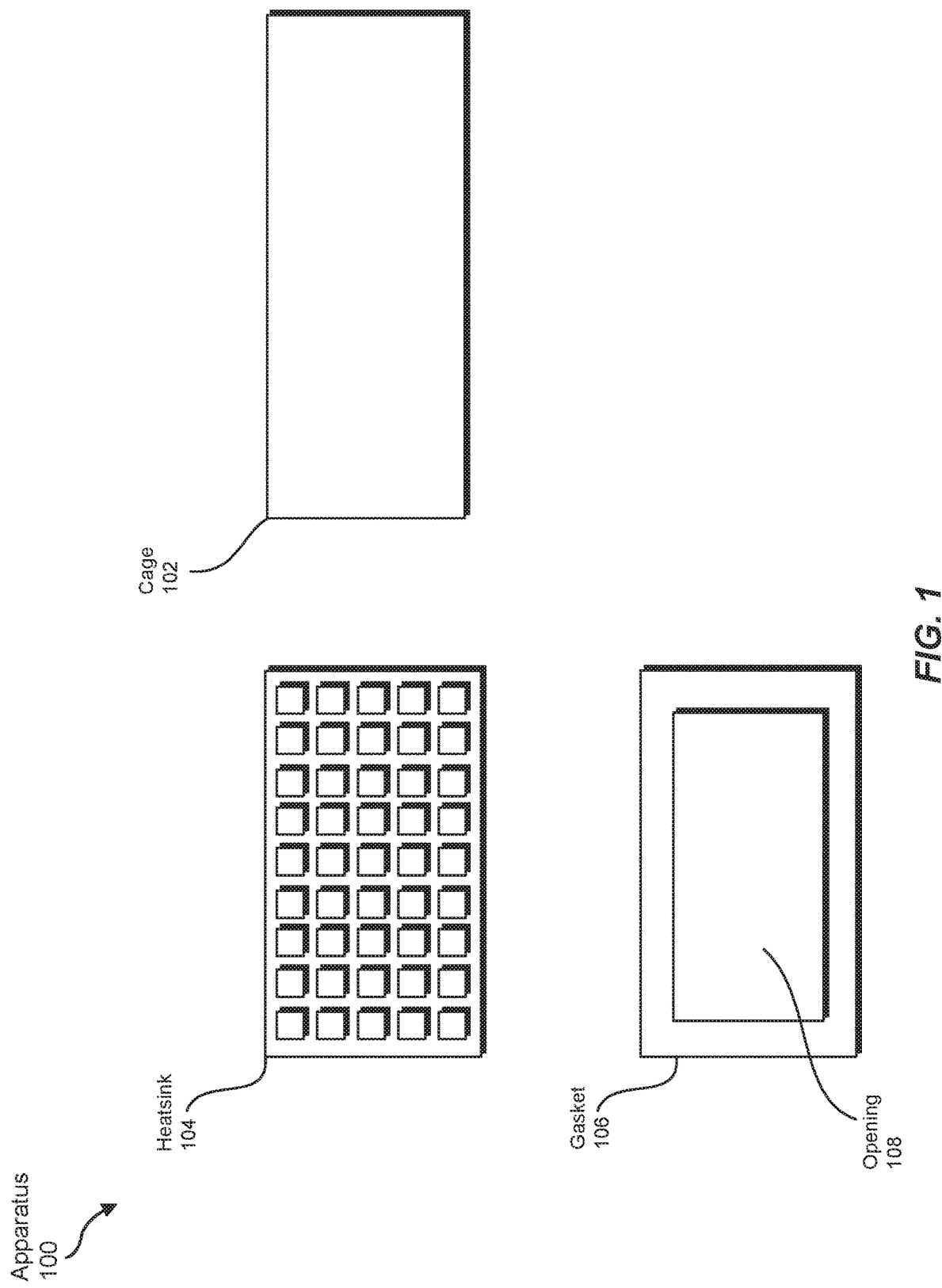
FIG. 1 is a block diagram an exemplary apparatus for mitigating electromagnetic noise in connection with optical modules in telecommunications devices.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for mitigating electromagnetic noise in connection with optical modules in telecommunications devices. As will be explained in greater detail below, embodiments of the instant disclosure may involve applying a gasket between a heatsink and a cage that facilitates communication for a telecommunications device. This gasket may reduce electromagnetic noise in connection with the operation of the optical module. For example, the gasket may prevent electromagnetic noise generated by the optical module from escaping the optical module's cage and/or interfering with other nearby components and/or devices. Additionally or alternatively, the gasket may prevent electromagnetic noise generated by a nearby component and/or device from penetrating and/or interfering with the optical module.

The following discussion will provide, with reference to FIGS. 1-5, examples of apparatuses, systems, and implementations that mitigate electromagnetic noise in connection with optical modules in telecommunications devices. In addition, the following discussion will provide, with reference to FIG. 6, examples of methods for mitigating electromagnetic noise in connection with optical modules in telecommunications devices.

FIG. 1 shows an exemplary apparatus 100 that mitigates electromagnetic noise in connection with optical modules in telecommunications devices. As illustrated in FIG. 1, apparatus 100 may include and/or represent a cage 102, a heatsink 104, and a gasket 106. The term "cage," as used herein, generally refers to a structure, housing, and/or connection mechanism that houses an optical module. In one example, cage 102 may represent an electromechanical connection interface. In this example, cage 102 may be designed to physically support, accept, and/or receive an optical module that facilitates communication for a telecommunications device (such as a router). In addition, cage 102 may serve as a form of electromagnetic shielding for optical module 302—though its shielding effectiveness, in the absence of additional electromagnetic shielding, may be far from perfect or ideal.

Continuing with this example, cage 102 may lock the optical module into place within the telecommunications device. In other words, cage 102 may physically maintain and/or hold the optical module within telecommunications device. In addition to its mechanical structure and purpose, cage 102 may also serve as an electrical and/or optical interface for the optical module. For example, cage 102 may effectively connect the optical module to the telecommunications device optically and/or electrically.

Cage 102 may be of various shapes and/or dimensions. In some examples, cage 102 may form a square, a rectangle, and/or a cube. Additional examples of shapes formed by cage 102 include, without limitation, ovals, circles, variations or combinations of one or more of the same, and/or any other suitable shapes.

In some examples, cage 102 may be sized in a particular way to house an optical module that facilitates communication for the telecommunications device. For example, cage 102 may be sized to fit within tight physical dimensions. By doing so, cage 102 and other similar cages may be able to form a row where multiple optical modules are housed just inside the telecommunications device.

Cage 102 may include and/or contain any of a variety of materials. Examples of such materials include, without limitation, metals, plastics, ceramics, polymers, composites, variations or combinations of one or more of the same, and/or any other suitable materials.

The term "heatsink," as used herein, generally refers to a device, structure, and/or mechanism that conducts, transfers, absorbs, and/or sinks heat. Heatsink 104 may be designed for the specific purpose of conducting, transferring, absorbing, and/or sinking heat. In one example, heatsink 104 may rest on and/or be applied to cage 102. By doing so, heatsink 104 may be able to make physical contact with an optical module installed in cage 102 and/or absorb heat generated by the optical module during operation in the telecommunications device.

Heatsink 104 may be of various shapes and/or dimensions. In some examples, heatsink 104 may form a square, a rectangle, and/or a cube. Additional examples of shapes formed by heatsink 104 include, without limitation, ovals, circles, triangles, diamonds, parallelograms, variations or combinations of one or more of the same, and/or any other suitable shapes. In one example, heatsink 104 may include and/or represent a finned and/or pin fin configuration or design.

In some examples, heatsink 104 may be sized in a particular way to maximize the amount of heat transferred from the optical module. In one example, heatsink 104 may run the length of one side of the optical module. Heatsink 104 may include a pedestal that passes through an opening in cage 102 to reach the optical module and/or make physical contact with the optical module for the purpose of absorbing heat generated by the optical module.

Heatsink 104 may include and/or contain a variety of materials. Examples of such heatsink materials include, without limitation, copper, aluminum, diamond, alloys of one or more of the same, combinations or variations of one or more of the same, and/or any other suitable materials.

The term "gasket," as used herein, generally refers to a mechanical seal that fills space at a junction between mating surfaces. In one example, gasket 106 may be designed to reduce electromagnetic noise in connection with the operation of the optical module. In other words, gasket 106 may include and/or represent a form of electromagnetic shielding applied to the top of the cage. In this example, gasket 106 may reside between heatsink 104 and t cage. By doing so, gasket 106 may effectively form a seal around cage 102, thereby preventing electromagnetic noise generated by the optical module from escaping cage 102 and/or preventing electromagnetic noise generated by nearby components and/or devices from penetrating cage 102.

In one example, gasket 106 may fill a void and/or air gap between heatsink 104 and the cage when the optical module is installed in cage 102. In other words, in the absence of gasket 106, a void and/or air gap may exist between heatsink 104 and the cage. Gasket 106 may increase the shielding effectiveness of cage 102. In doing so, gasket 106 may mitigate the potential harm, interference, and/or performance degradation caused by electromagnetic noise from the optical module and/or nearby components or devices. Gasket 106 may also enable cage 102 to better comply with the regulations implemented by governmental bodies to limit the amount of electromagnetic radiation that such optical modules are allowed to emit—even as this technology advances and/or its performance continues to improve.

In one example, gasket 106 may include and/or form an opening 108 through which heatsink 104 makes physical contact with the optical module. For example, the pedestal of heatsink 104 may pass through opening 108 of gasket 106 to reach and make physical contact with the optical module. In this example, opening 108 may be designed in size and/or shape to accommodate the pedestal of heatsink 104.

Gasket 106 may be of various shapes and/or dimensions. In some examples, gasket 106 may form a square and/or rectangle. Additional examples of shapes formed by gasket 106 include, without limitation, ovals, circles, triangles, diamonds, parallelograms, variations or combinations of one or more of the same, and/or any other suitable shapes.

Gasket 106 may include and/or contain a variety of materials. In one example, gasket 106 may be composed of one or more elastomers. Additional examples of gasket materials include, without limitation, rubbers, papers, plastics, silicones, metals, corks, neoprenes, fiberglasses, polytetrafluorethylenes, polymers, combinations or variations of one or more of the same, and/or any other suitable materials.

In some examples, cage 102 may be coupled to a circuit board (e.g., a printed circuit board) of a telecommunications device. In one example, cage 102 may house an optical module that facilitates communication for the telecommunications device.

In some examples, heatsink 104 may make physical contact with the optical module via an opening of cage 102. In one example, heatsink 104 may absorb heat generated by the optical module during operation in the telecommunications device. In this example, gasket 106 may reside between heatsink 104 and the cage. Gasket 106 may reduce electromagnetic noise in connection with the operation of the optical module.

Figure 2:
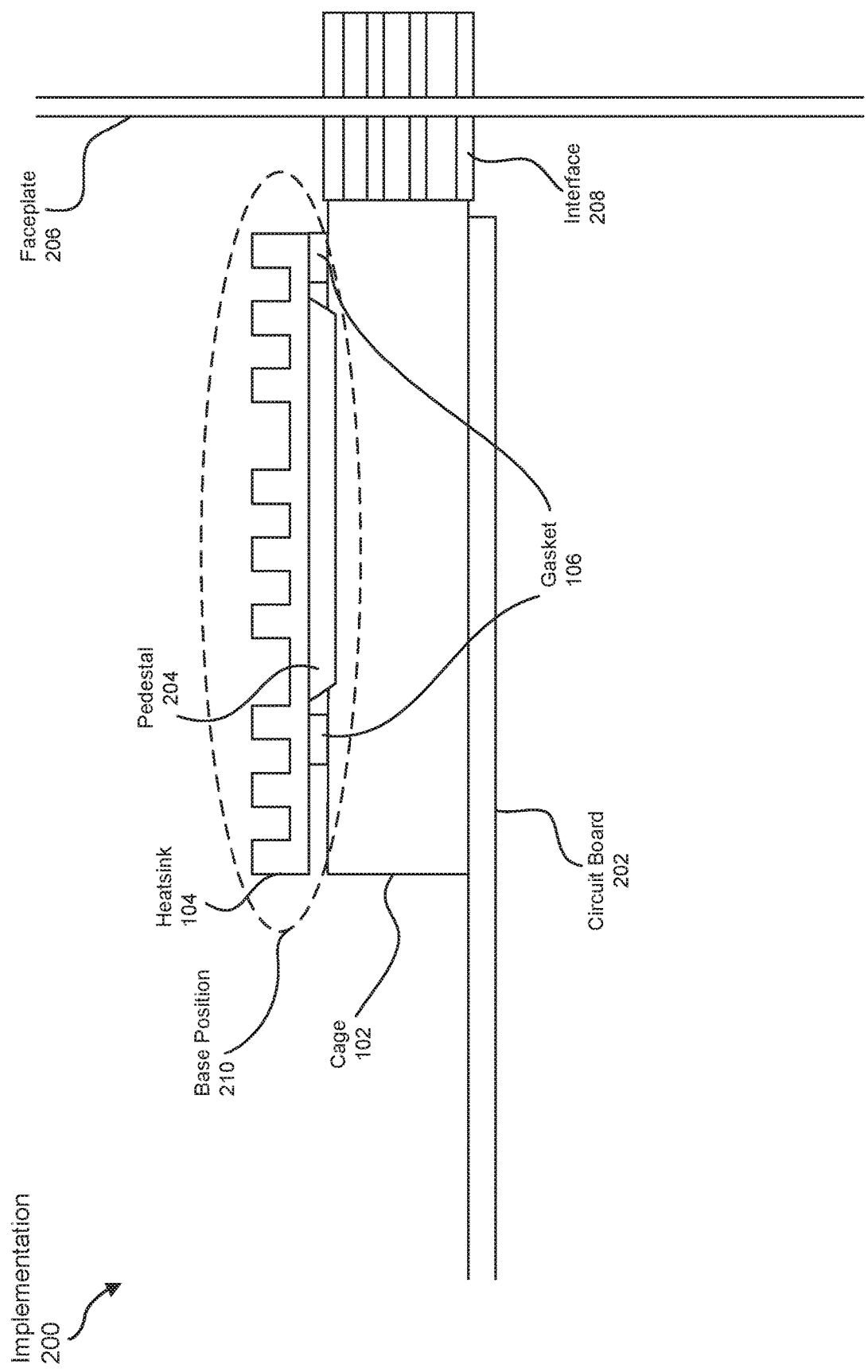
FIG. 2 is a block diagram of an exemplary implementation of an apparatus for mitigating electromagnetic noise in connection with optical modules in telecommunications devices.

FIG. 2 shows a cross-sectional view of an exemplary implementation 200 of apparatus 100 in FIG. 1. For example, implementation 200 may include cage 102 coupled to a circuit board 202 of a telecommunications device. In this example, cage 102 may also be coupled to a faceplate 206 of the telecommunications device via an interface 208. Examples of such a telecommunications device include, without limitation, routers, gateways, switches, hubs, modems, bridges, repeaters, multiplexers, network adapters, network interfaces, network racks, servers, portions of one or more of the same, combinations or variations of one or more of the same, and/or any other suitable telecommunications device.

In FIG. 2, faceplate 206 may mark the boundary of the telecommunications device. For example, the left side of faceplate 206 in FIG. 2 may represent and/or correspond to the interior of the telecommunications device. In contrast, the right side of faceplate 206 in FIG. 2 may represent and/or correspond to the exterior of the telecommunications device.

Although cage 102 is designed to house a removable optical module, the illustration in FIG. 2 may represent a position and/or stage of apparatus 100 in which the optical module is not installed in cage 102. As illustrated in FIG. 2, heatsink 104 may sit atop cage 102 and/or include a pedestal 204. In this example, pedestal 204 may extend toward the compartment dedicated to housing the optical module. Additionally or alternatively, pedestal 204 may pass through opening 108 of gasket 106.

In one example, gasket 106 may adhere to and/or be held against heatsink 104. For example, an adhesive and/or a clip may hold gasket 106 to heatsink 104 even when the optical module is removed. Additionally or alternatively, gasket 106 may be held against heatsink 104 by friction and/or tension.

In one example, heatsink 104 may rest and/or sit in a base position 210 when the optical module is removed from cage 102. In base position 210, heatsink 104 may be resting and/or sitting at its lowest position. As will be explained in greater detail below, heatsink 104 may be elevated from base position 210 as the optical module is installed into cage 102.

Figure 3:
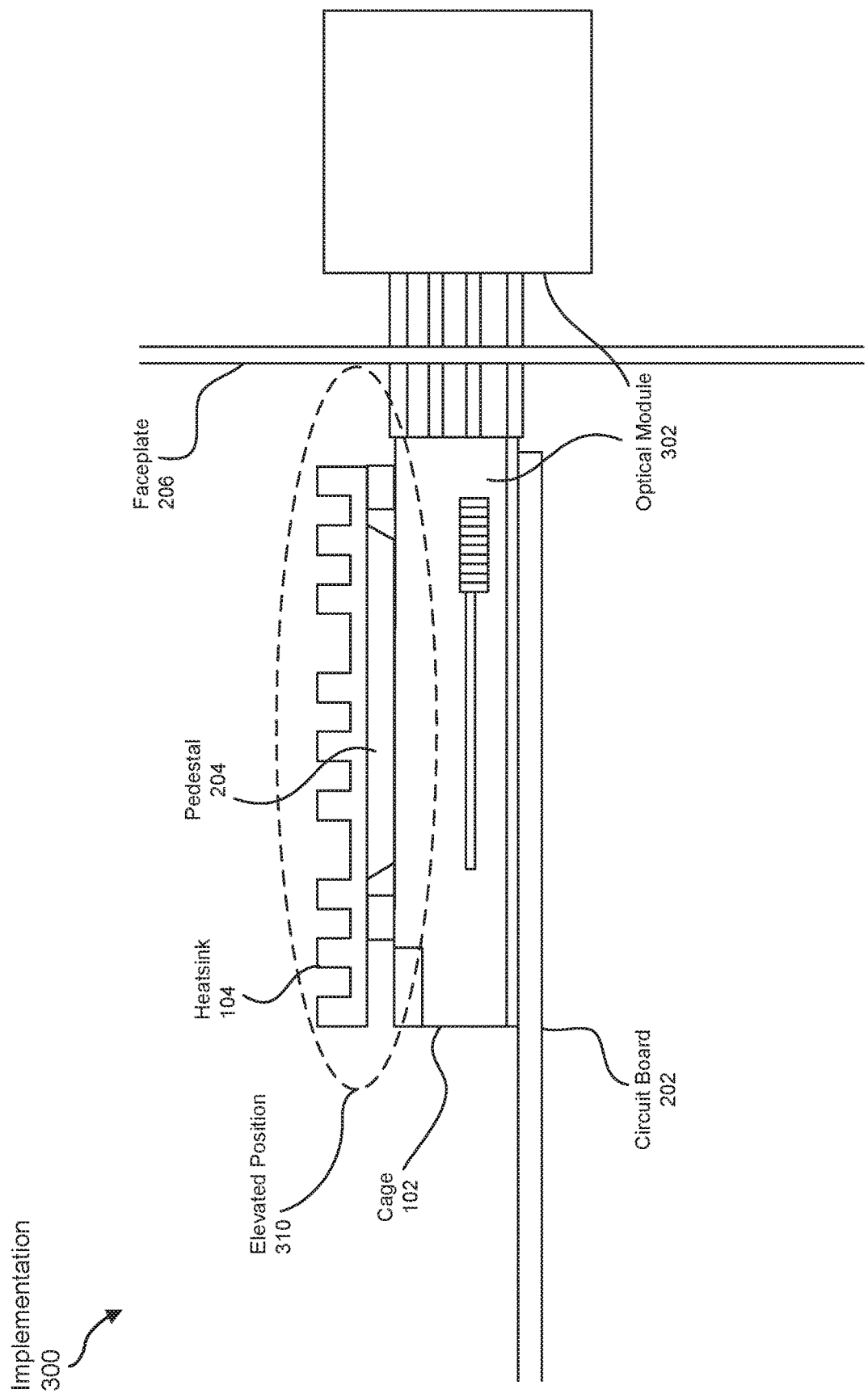
FIG. 3 is a block diagram of an exemplary implementation of an apparatus for mitigating electromagnetic noise in connection with optical modules in telecommunications devices.

FIG. 3 shows a cross-sectional view of an exemplary implementation 300 of apparatus 100 in FIG. 1. For example, implementation 300 may represent the disposition of apparatus 100 after an optical module 302 is installed into cage 102. As illustrated in FIG. 3, optical module 302 may be installed into cage 102. During the installation process, optical module 302 may effectively lift and/or push up pedestal 204 of heatsink 104, thereby propping up heatsink 104 from base position 210 to elevated position 310. After completion of the installation process, one portion of optical module 302 may enter the interior of the telecommunications device, and another portion may remain external to the telecommunications device.

In one example, gasket 106 may fill an air gap that would have otherwise formed between heatsink 104 and cage 102. In other words, the absence of gasket 106 may have created and/or formed an air gap as heatsink 104 rose up from base position 210 to elevated position 310 during the installation of optical module 302 into cage 102. Such an air gap may have left cage 102 with poor shield effectiveness, thereby enabling electromagnetic noise generated by optical module 302 to escape cage 102 and/or electromagnetic noise generated by nearby devices and/or components to penetrate cage 102.

The term "optical module," as used herein, generally refers to a physical device or component capable of sending and/or receiving data by way of optical data transmissions. In one example, optical module 302 may include and/or represent a transceiver in a fiber optic system. In this example, optical module 302 may include (1) a transmitter that uses light (e.g., a laser) to transmit data a fiber optic channel and/or (2) a detector that detects light to receive data across a fiber optic channel. Optical module 302 may include and/or represent a physical, hot-pluggable component.

Optical module 302 may be of various shapes and/or dimensions. In one example, optical module 302 may be formed in a Small Form-Factor (SFP) pluggable package and/or Quad SFP (QSFP) pluggable package. In this example, optical module 302 may support SONET, GIGABIT ETHERNET, FIBRE CHANNEL, and/or other communications standards. Additionally or alternatively, optical module 302 may plug into SFP and/or QSFP sockets, ports, and/or cages (such as cage 102). Optical module 302 may couple circuit board 202 to a fiber optic, copper, and/or other network cable. In this way, optical module 302 may enable the telecommunications device to communicate with other computing devices within the same network and/or across multiple networks.

In some examples, optical module 302 may be manually installed and/or inserted into cage 102 by a human operator (e.g., a network administrator). Similarly, optical module 302 may be manually removed and/or ejected from cage 102 by a human operator.

In other examples, optical module 302 may be automatically installed and/or inserted by a robotic technician or device. Similarly, optical module 302 may be automatically removed and/or ejected from cage 102 by a robotic technician or device.

As illustrated in FIG. 3, in elevated position 310, heatsink 104 may make physical contact with optical module 302. By doing so, heatsink 104 may be able to absorb and/or conduct heat generated by optical module 302 during operation in the telecommunications device. In this example, gasket 106 (not labelled in FIG. 3) may be formatted in a rectangular shape. Opening 108 of gasket 106 may allow pedestal 204 to reach and/or make physical contact with optical module 302.

In one example, gasket 106 may form at least a partial seal around cage 102. This partial seal may effectively block electromagnetic noise generated by optical module 302 from escaping from cage 102 and/or interfering with other components and/or devices. This partial seal may also effectively immunize optical module 302 from being penetrated by electromagnetic noise generated by neighboring components and/or devices. However, this partial seal may not fully prohibit the passage of air from reaching optical module 302. In other words, optical module 302 may still benefit from the cooling properties of air despite the installation and/or addition of gasket 106.

The term "electromagnetic noise," as used herein, generally refers to electromagnetic radiation capable of interfering with and/or inhibiting the functionality and/or performance of a component or device. In one example, electromagnetic radiation generated by one device (e.g., optical module 302) may become noise and/or ElectroMagnetic Interference (EMI) upon escaping its shielding and/or penetrating another device. In other words, one device's radiation emissions may evolve into and/or become another device's noise and/or EMI.

Figure 4:
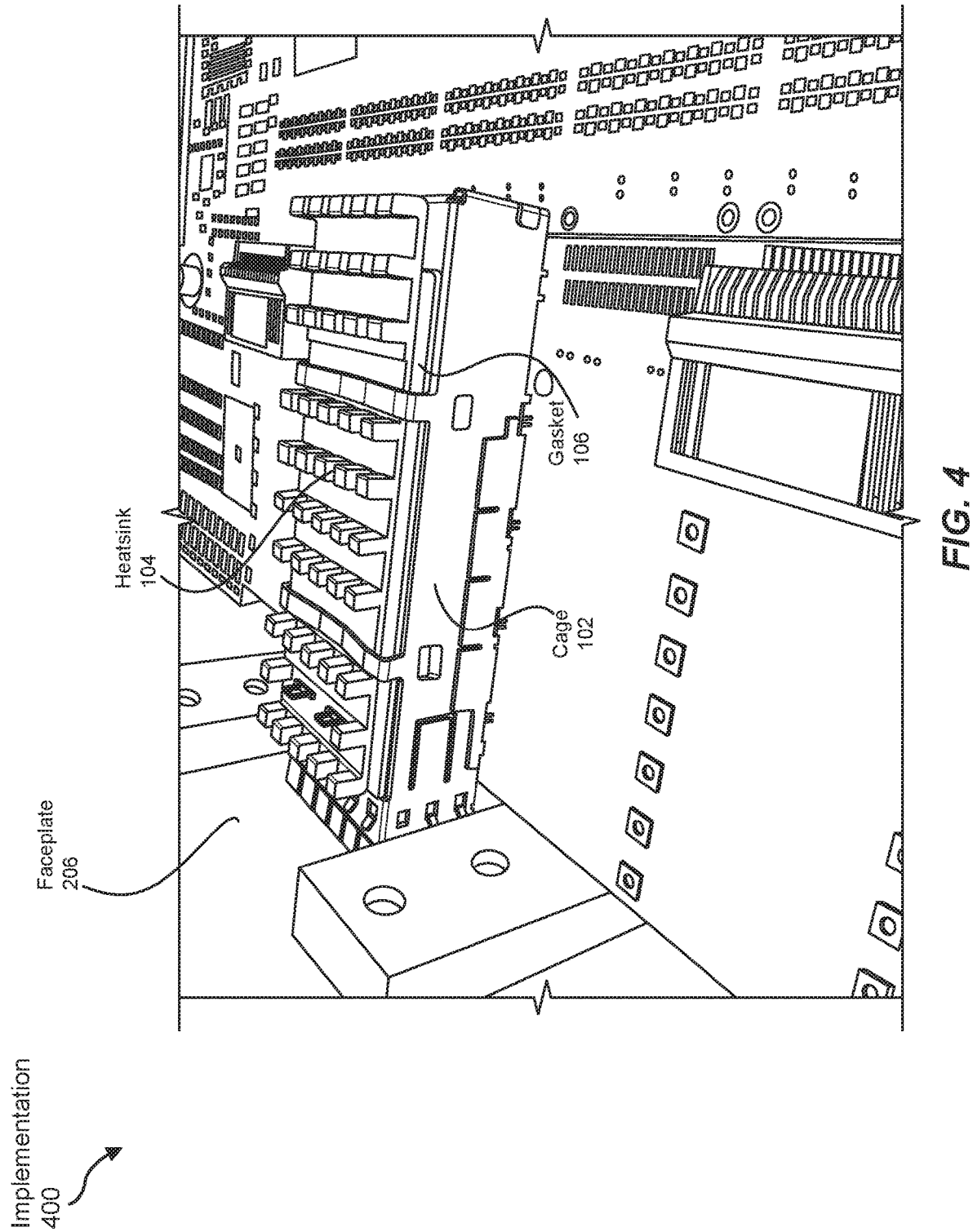
FIG. 4 is an illustration of an exemplary apparatus for mitigating electromagnetic noise in connection with optical modules in telecommunications devices.
Figure 5:
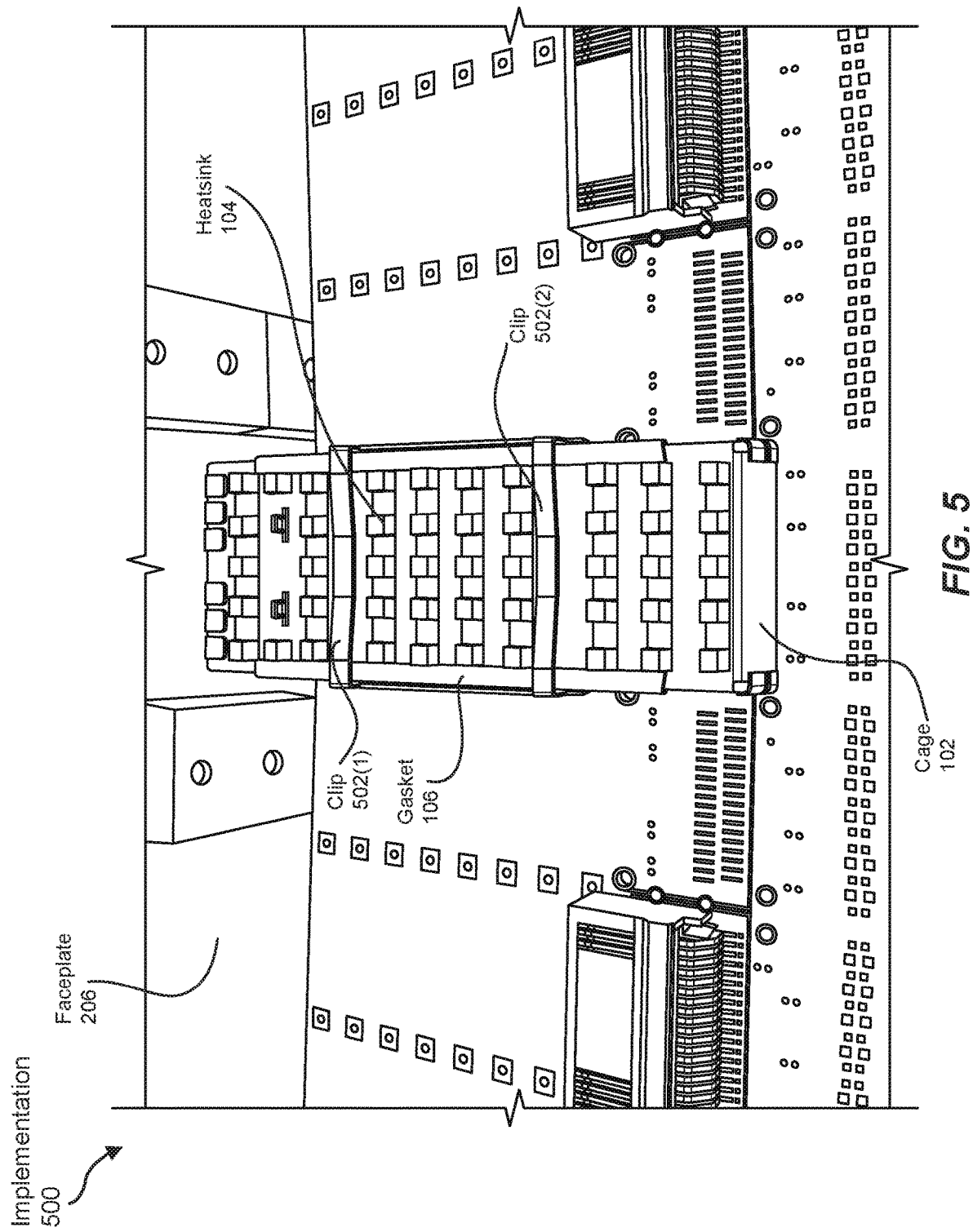
FIG. 5 is an illustration of an exemplary apparatus for mitigating electromagnetic noise in connection with optical modules in telecommunications devices.

FIGS. 4 and 5 show exemplary implementations 400 and 500 of apparatus 100 in FIG. 1. As illustrated in FIGS. 4 and 5, implementations 400 and 500 may include various components incorporated into the interior of the telecommunications device. For example, the telecommunications device may incorporate the individual components of apparatus 100, including cage 102, heatsink 104, and/or gasket 106. Although not explicitly illustrated in FIGS. 4 and 5, optical module 302 may be installed in cage 102, thereby propping up heatsink 104 from base position 210 to elevated position 310.

As illustrated in FIG. 5, cage 102 may include one or more clips 502(1)-(2) that press heatsink 104 against optical module 302. In other words, clips 502(1)-(2) may maintain heatsink 104 in place with respect to cage 102 and/or optical module 302. Accordingly, clips 502(1)-(2) may hold down heatsink 104 after optical module 302 has lifted heatsink 104 to a certain level as optical module 302 is installed into cage 102.

Figure 6:
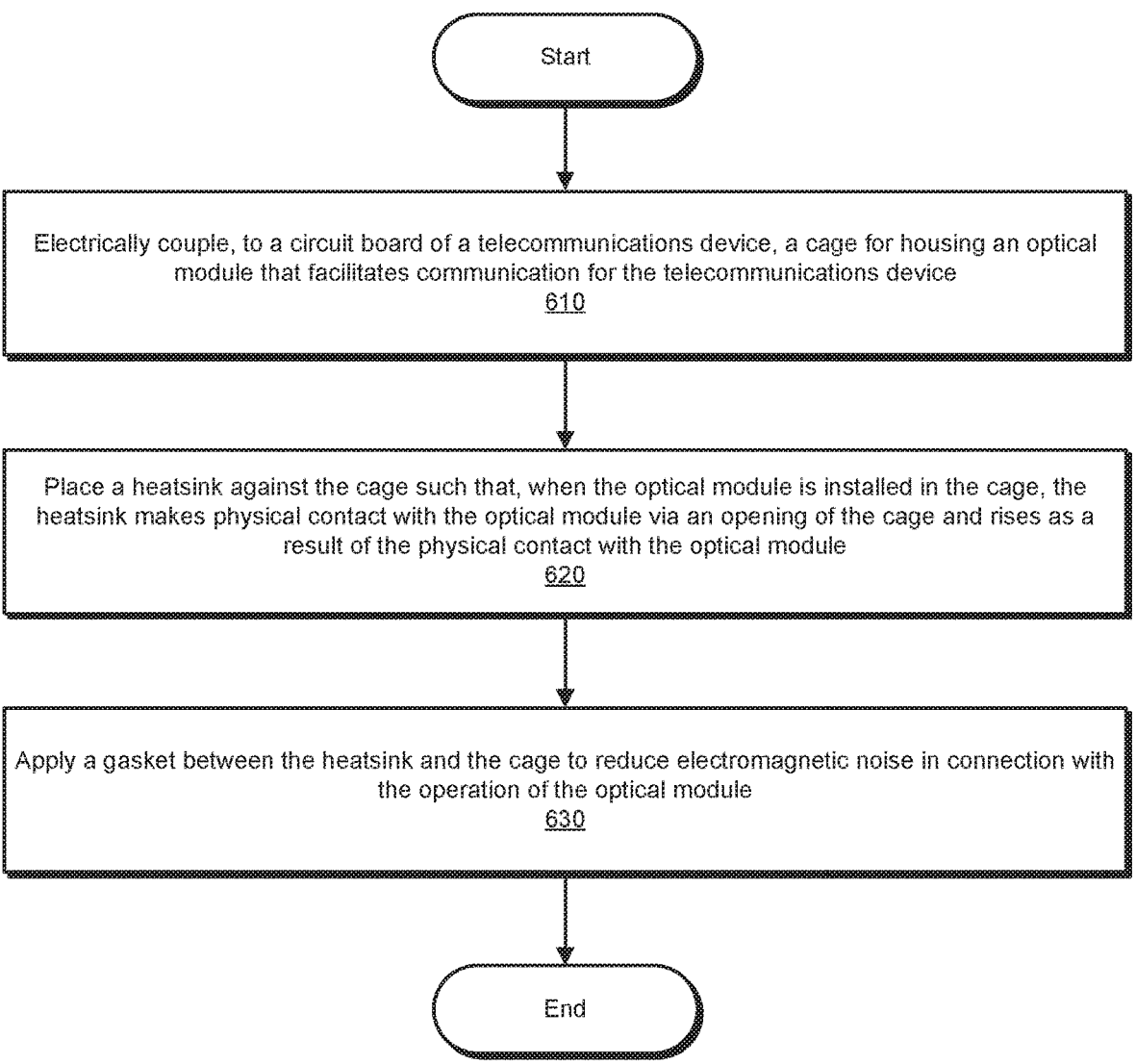
FIG. 6 is a flow diagram of an exemplary method for mitigating electromagnetic noise in connection with optical modules in telecommunications devices.

FIG. 6 is a flow diagram of an exemplary method 600 for mitigating electromagnetic noise in connection with optical modules in telecommunications devices. Method 600 may include the step of coupling, to a circuit board of a telecommunications device, a cage for housing an optical module that facilitates communication for the telecommunications device (610). This coupling step may be performed in a variety of ways. For example, a network equipment manufacturer may couple a cage for housing an optical module to a circuit board of a telecommunications device.

Returning to FIG. 6, method 600 may also include the step of placing a heatsink against the cage such that, when the optical module is installed in the cage, the heatsink makes physical contact with the optical module via an opening of the cage and rises as a result of the physical contact with the optical module (620). This placing step may be performed in a variety of ways. For example, a network equipment manufacturer may place, position, and/or apply a heatsink against the cage. By doing so, the heatsink may make physical contact with the optical module when the optical module is installed in the cage. The heatsink may also rise as a result of the physical contact with the optical module.

Returning to FIG. 6, method 600 may also include the step of applying a gasket between the heatsink and the cage to reduce electromagnetic noise in connection with the operation of the optical module (630). This applying step may be performed in a variety of ways. For example, a network equipment manufacturer may apply a gasket between the heatsink and the cage to reduce electromagnetic noise in connection with the operation of the optical module. In one example, the network equipment manufacturer may adhere the gasket between the heatsink and the cage by way of an adhesive. In another example, the network equipment manufacturer may maintain the gasket between the heatsink and the cage by way of tension and/or friction.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a cage that:
      is coupled to a circuit board of a telecommunications device; and
      includes a compartment dedicated to housing an optical module that facilitates communication for the telecommunications device;
   a heatsink that includes a pedestal, wherein the heatsink:
      sits on top of the cage in a base position such that the pedestal extends into the compartment of the cage via an opening of the cage when the optical module is not installed in the cage;
      is lifted from the base position to an elevated position as the optical module is installed into the cage due to physical contact between the pedestal and the optical module;
      absorbs heat generated by the optical module during operation in the telecommunications device by way of the physical contact between the pedestal and the optical module;
   a gasket that:
      resides between the heatsink and the cage;
      fills space between the heatsink and the cage;
      extends from the opening of the cage to a first wall of the cage beyond a first edge of the heatsink;
      extends from the opening of the cage to a second wall of the cage beyond a second edge of the heatsink;

reduces electromagnetic noise in connection with the operation of the optical module in the telecommunications device; and is adhered to the heatsink by an adhesive that holds the gasket against the heatsink even when the optical module is removed from the cage.

2. The apparatus of claim 1, further comprising at least one clip that presses the heatsink against the optical module via the opening of the cage.

3. The apparatus of claim 1, wherein the gasket:
is formatted in a rectangular shape; and
includes an opening through which the heatsink makes physical contact with the optical module.

4. The apparatus of claim 3, wherein the heatsink includes a pedestal that:
extends toward the optical module; and
passes through the opening of the gasket and the opening of the cage to make physical contact with the optical module.

5. The apparatus of claim 1, wherein the gasket reduces the electromagnetic noise in connection with the operation of the optical module by preventing at least some electromagnetic noise generated by the optical module from escaping the cage.

6. The apparatus of claim 1, wherein the gasket reduces the electromagnetic noise in connection with the operation of the optical module by preventing at least some electromagnetic noise generated by another device that is located physically proximate to the telecommunications device from penetrating the cage.

7. The apparatus of claim 1, wherein the gasket reduces the electromagnetic noise in connection with the operation of the optical module by:
filling an air gap between the heatsink and the cage; and
increasing a shielding effectiveness of the cage.

8. The apparatus of claim 7, wherein the air gap between the heatsink and the cage is formed as the heatsink rises during installation of the optical module into the cage.

9. The apparatus of claim 1, wherein the gasket is composed of an elastomer.

10. The apparatus of claim 1, wherein the gasket forms a partial seal around the opening of the cage such that air is still able to reach and cool the optical module despite the gasket residing between the heatsink and the cage.

11. A telecommunications device comprising:
an optical module that facilitates communication;
a cage that:
is coupled to a circuit board; and
includes a compartment dedicated to housing the optical module when the optical module is installed;
a heatsink that includes a pedestal, wherein the heatsink:
sits on top of the cage in a base position such that the pedestal extends into the compartment of the cage via an opening of the cage when the optical module is not installed in the cage;
is lifted from the base position to an elevated position as the optical module is installed into the cage due to physical contact between the pedestal and the optical module;
absorbs heat generated by the optical module during operation by way of the physical contact between the pedestal and the optical module; and
a gasket that:
resides between the heatsink and the cage;
fills space between the heatsink and the cage;
extends from the opening of the cage to a first wall of the cage beyond a first edge of the heatsink;
extends from the opening of the cage to a second wall of the cage beyond a second edge of the heatsink;
reduces electromagnetic noise in connection with the operation of the optical module; and
is adhered to the heatsink by an adhesive that holds the gasket against the heatsink even when the optical module is removed from the cage.

12. The telecommunications device of claim 11, further comprising at least one clip that presses the heatsink against the optical module via the opening of the cage.

13. The telecommunications device of claim 11, wherein the gasket:
is formatted in a rectangular shape; and
includes an opening through which the heatsink makes physical contact with the optical module.

14. The telecommunications device of claim 13, wherein the heatsink includes a pedestal that:
extends toward the optical module; and
passes through the opening of the gasket and the opening of the cage to make physical contact with the optical module.

15. The telecommunications device of claim 11, wherein the gasket reduces the electromagnetic noise in connection with the operation of the optical module by preventing at least some electromagnetic noise generated by the optical module from escaping the cage.

16. The telecommunications device of claim 11, wherein the gasket reduces the electromagnetic noise in connection with the operation of the optical module by preventing at least some electromagnetic noise generated by another device that is located physically proximate to the telecommunications device from penetrating the cage.

17. The telecommunications device of claim 11, wherein the gasket reduces the electromagnetic noise in connection with the operation of the optical module by:
filling an air gap between the heatsink and the cage; and
increasing a shielding effectiveness of the cage.

18. A method comprising:
coupling, to a circuit board of a telecommunications device, a cage that includes a compartment dedicated to housing an optical module that facilitates communication for the telecommunications device;
placing a heatsink that includes a pedestal against the cage such that:
when the optical module is not installed in the cage, the heatsink sits on top of the cage in a base position such that the pedestal extends into the compartment of the cage via an opening of the cage; and
as the optical module is installed in the cage, the heatsink is lifted from the base position to an elevated position due to physical contact between the pedestal and the optical module; and
applying a gasket between the heatsink and the cage to reduce electromagnetic noise in connection with the operation of the optical module such that the gasket:
fills space between the heatsink and the cage;
extends from the opening of the cage to a first wall of the cage beyond a first edge of the heatsink; and
extends from the opening of the cage to a second wall of the cage beyond a second edge of the heatsink; and
adhering the gasket to the heatsink with an adhesive that holds the gasket against the heatsink even when the optical module is removed from the cage.

* * * * *